United States Patent [19]
Borel et al.

[11] 4,143,266
[45] Mar. 6, 1979

[54] METHOD AND DEVICE FOR DETECTING RADIATONS

[75] Inventors: Joseph Borel, Echirolles; Vincent Le Goascoz, Claix, both of France

[73] Assignee: Commissariat a l'Energie Atomique, Paris, France

[21] Appl. No.: 900,088

[22] Filed: Apr. 26, 1978

Related U.S. Application Data

[63] Continuation of Ser. No. 611,851, Sep. 10, 1975, abandoned.

[51] Int. Cl.² .............................................. H01J 39/12
[52] U.S. Cl. .................................. 250/211 J; 357/4; 357/23; 357/30; 357/90
[58] Field of Search .................. 357/4, 23, 30, 90; 250/211 J

[56] References Cited
U.S. PATENT DOCUMENTS

| 3,704,376 | 11/1972 | Lehovec et al. | 357/30 |
| 3,863,070 | 1/1975 | Wheeler et al. | 357/30 |

OTHER PUBLICATIONS

IBM - Tech. Bul., vol. 15, No. 4, Sep. 1972, p. 1348, Forbes.

*Primary Examiner*—Edward J. Wojciechowicz
*Attorney, Agent, or Firm*—McNenny, Pearne, Gordon, Gail, Dickinson & Schiller

[57] ABSTRACT

The method consists in fabricating an MOS transistor comprising a drain region and a source region separated from each other by a bulk region of opposite doping type relative to the first two regions, in delivering the radiation to be detected into the carrier-collection region of the MOS transistor, in leaving the bulk region at a floating potential and in collecting the drain-source current of the transistor.

5 Claims, 6 Drawing Figures

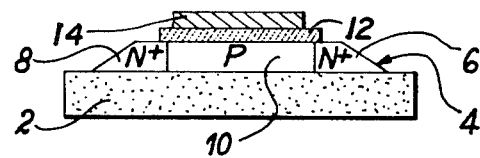
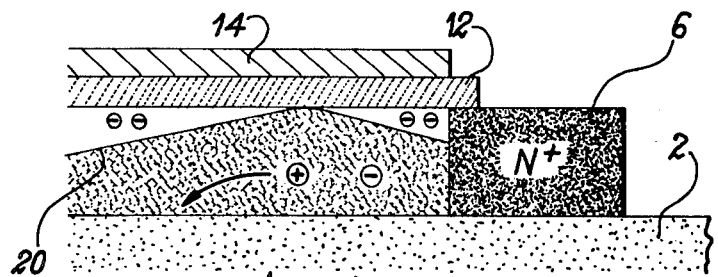
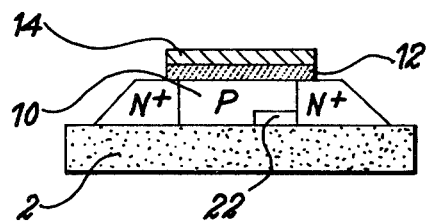
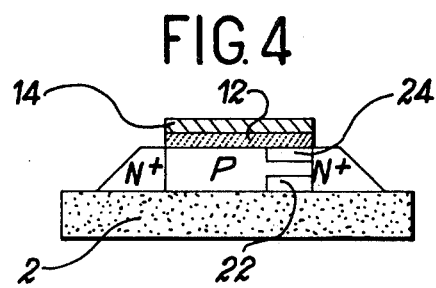
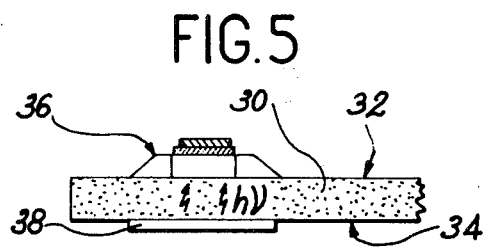
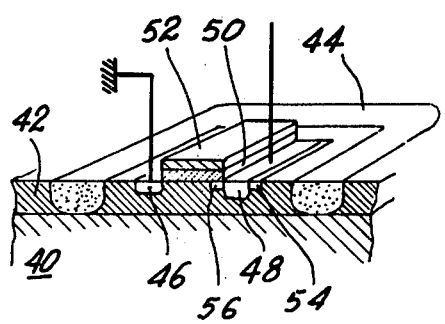

METHOD AND DEVICE FOR DETECTING RADIATONS

This is a continuation of application Ser. No. 611,851, filed Sept. 10, 1975, now abandoned.

This invention relates to a method for detecting radiations and to devices obtained as a result of the application of said method.

It is known that the appearance of radiations and in particular of photons can be detected by means of semiconductor devices. In devices of this type, the energy of photons which penetrate into the semiconductor crystal creates an electron-hole pair. If the semiconductor has a biased n-p junction, a current will flow within the mass of the semiconductor and thus make it possible to detect the impact of the photons on said device.

Among the semiconductor devices which are most commonly employed for converting light energy to electrical energy can be mentioned the photoelectric diodes. However, these devices have a disadvantage in that they provide a gain which is either lower than or equal to unity. In order to collect a current which is directly usable, the use of an associated amplifier is therefore necessary.

The present invention is precisely directed to a method for detecting radiations which overcomes the disadvantage mentioned above and makes it possible to obtain good properties of conversion of radiations to electrical energy with a sufficiently high gain to avoid the need to employ an associated amplifier circuit.

The method according to the invention consists in producing an MOS transistor, in directing the radiation to be detected into the carrier collection region of said MOS transistor, in maintaining the substrate of said transistor at a free potential and in collecting the drain-source current of said MOS transistor.

MOS transistors are well-known semiconductor components. However, they are always employed in the construction of electronic circuits which are usually of the integrated type and essentially of the logic type (it is possible to mention by way of example the construction of logic gates, flip-flops, memory or storage devices, shift registers and the like) or of analog type (amplifiers, for example).

The present inventors have in fact found that, by subjecting an MOS transistor which can in any case be of a wholly known type to a radiation in the carrier collection region and by maintaining the substrate at a free potential, an additional flow of current resulting from said radiation was obtained between the drain electrode and the source electrode. On the contrary, when making use of MOS transistors in the construction of integrated circuits, it is known that the substrate is always maintained at a constant potential which is usually the ground potential of the system.

One of the major advantages of the invention which consists in employing an MOS transistor which can be of known type in order to detect radiations such as photon radiations lies in the fact that the gain obtained can be one hundred times higher than that obtained by means of known detectors such as photodiodes.

However, in addition to the use of the conventional MOS transistor for the detection of radiations, the invention is also directed to methods of construction of MOS transistors of a particular type which permit a further improvement in the conversion efficiency of transistors of this type.

Preferably, the MOS transistor is fabricated on a substrate which is insulated with respect to the so-called "bulk region" of the substrate of the MOS transistor.

In accordance with a first alternative embodiment, the electrically insulated substrate is fabricated by means of an insulating material such as sapphire or spinel if the semiconductor is silicon.

In accordance with a second alternative embodiment, the insulated substrate is formed of intrinsic semiconductor material.

In accordance with a third alternative embodiment, the substrate is insulated by means of a space charge zone.

For example, in accordance with the third alternative embodiment just mentioned, the insulated substrate is formed of semiconductor material if the MOS transistor proper is also fabricated from the same semiconductor material, but the bulk region is doped with impurities of opposite type relative to the impurities with which the substrate is initially doped in order to form the MOS transistor proper. The bulk region and the substrate region are reverse-biased, thus effectively providing electrical insulation between the substrate and the bulk region of the MOS transistor.

The present invention is also concerned with a more highly improved method of fabrication of insulated-substrate MOS transistors for radiation detection which essentially consists in increasing the doping in the carrier-collection zone of the bulk region of the substrate. In the alternative embodiments of the invention which involve fabrication on an insulated substrate, the improved method in accordance with the invention can be carried into practical effect by increasing the doping in that portion of the bulk region which is adjacent to the drain and to the insulated substrate so as to ensure that the electric field is of maximum value in said portion and thus gives rise to multiplication of the carriers which are created within said portion by the radiation.

The doping aforesaid can be obtained by uniform doping of the so-called bulk region with an increased impurity content, for example of the order of $5 \times 10^{16}$ at/cm$^3$.

Preferably, the fabrication of the MOS-on-insulator transistor is completed by a step which consists in forming within the bulk region which is in contact with the drain region and with the gate insulation layer a zone of the same doping type as the drain region but having a considerably lower impurity content, with the result that the electric field within said zone is either lower than or equal to the critical electric field (said critical electric field is defined as the value from which a multiplication of carriers takes place within the channel).

The above-mentioned uniform and complementary doping can be obtained by thermal diffusion or by ion implantation.

Enhanced doping in that zone of the bulk region which is adjacent to the drain and to the insulated substrate can also be obtained directly on a substrate which is doped with the usual proportions of impurities.

Doping of the bulk zone adjacent to the drain and to the insulated substrate can accordingly be obtained by deep ion implantation.

The doping process can also be completed by forming in the bulk zone which is in contact with the drain region and with the gate insulation layer, a zone of the same doping type as the drain region but having a very much lower impurity content.

The present invention also relates to devices which serve to carry out said method and to detect radiations.

A more complete understanding of the invention will in any case be obtained from the following description which relates to a number of practical embodiments of the method according to the invention as well as to the transistors obtained, reference being made to the accompanying drawings, wherein:

FIG. 1 is a vertical sectional view of an MOS-on-insulator transistor;

FIG. 2 is a view of part of an MOS transistor showing the effect produced by a photon beam;

FIGS. 3, 4 and 6 show three embodiments of MOS transistors in accordance with the invention;

FIG. 5 shows one example of utilization of transistors of this type for fabricating two optical-coupling integrated circuits on a common substrate.

As already mentioned in the foregoing, the invention involves the use of a detector consisting of an MOS transistor of any suitable type but having a floating bulk region of the substrate. To this end, it is an advantage to employ a transistor in which the substrate is electrically insulated from the bulk region.

A first solution consists in making use of a transistor in which the substrate is constituted by a solid silicon layer. In this case, the solid layer is intrinsic or doped with a first type of impurities and the thin layer constituting the transistor proper is doped at the outset with an opposite type of impurities. These two layers are reverse-biased and the thin layer is therefore effectively insulated electrically from the substrate.

In the description which now follows, consideration will be given to methods for improving the conversion properties of MOS transistors on insulated substrates in which the substrate is made of insulating material. It is wholly apparent, however, that these methods could very readily be applied to the case of transistors on insulated substrates of semiconductor. material.

As illustrated diagrammatically, the transistor comprises an insulating substrate 2 which is preferably formed of sapphire or of spinel. On this substrate is formed a thin layer 4 of semiconductor material such as silicon, for example.

The substrate of insulating material can also be constituted by a solid silicon layer. In this case, the solid layer is intrinsic and the thin layer 4 is well-insulated from the insulating substrate 2.

In the description which follows hereafter, it must be understood that the term "insulating substrate" is used in a very broad sense, that is to say within either of the two meanings defined in the foregoing.

Within the silicon 4 are present an $n^+$ type drain region 6 and an $n^+$ type source region 8. Provision is made between these two regions for a p-type bulk region 10 of the substrate. Above the region 10 is formed a thin layer of insulator 12 usually designated as the gate insulator (for example of silica or of silicon nitride) and, on said layer 12, a gate electrode 14 which can be of aluminum or of polycrystalline silicon, for example. The source and the drain are also provided with an electric contact.

It is known that, by applying a potential difference $V_{DS}$ between the source and the drain, a flow of current $I_{DS}$ is induced when applying to the gate electrode 14 a voltage of sufficient value to create an inversion channel within the bulk region 10.

It is readily apparent that there also exist MOS transistors in which the source and the drain are $p^+$ type and the bulk region is n-type (these are accordingly known as p-channel transistors).

Moreover, these MOS transistors can equally well be fabricated from semiconductor materials other than silicon. By way of example, mention can be made of substances such as AsGa and InP.

In order to gain a clearer understanding of the solution which has been found for this problem, reference can advantageously be made to FIG. 2 of the accompanying drawings. In this figure (in which the same reference numerals as in FIG. 1 have again been adopted), the arrows represent the incident photons of energy $h\nu$ which traverse the insulating substrate 2, said substrate being transparent to this radiation. The inversion channel is also designated by the line 20.

As mentioned earlier, the incident photons create electron-hole pairs. These carriers produce a current $I_{PH}$ which is multiplied by a multiplication factor $\mu'$. This factor is clearly dependent on the electric field which prevails within the region of formation of the electron-hole pairs.

The current aforesaid, which is the forward current of the bulk-source junction (since the substrate is insulated), biases the bulk region and the result thereby achieved is a potential difference $V_{BS}$. In point of fact, it is known that the threshold voltage $V_{TH}$ of an MOS transistor is given by the formula:

$$V_{TH} \, V_{THO} + k \sqrt{-V_{BS} + V_O}$$

where $V_{THO}$, k and $V_O$ are constants. Since the voltage $V_{BS}$ is positive, an increase in $V_{BS}$ reduces the value of $V_{TH}$.

Moreover, the current $I_{DS}$ which flows between the source and the drain varies in inverse ratio to the threshold voltage $V_{TH}$. It is therefore apparent that, by biasing the bulk region, the current $I_{TH}$ produces an increase in the current $I_{DS}$.

Said current $I_{DS}$ is therefore a function of the radiation received by the MOS transistor, more precisely within the carrier collection region. Said region is defined as the space charge region increased by a surrounding zone or so-called carrier diffusion zone. The carriers within this zone are capable of returning to the space charge region by diffusion.

In order to permit readier utilization of this phenomenon and collection of a sufficient current $I_{DS}$, the method according to the invention proposes to increase the electric field within the carrier collection region and to make said field higher than, or in the vicinity of, the critical field of the semiconductor material. Said critical field is the field above which electron-hole pairs are created within the space charge at the time of transit of an electron or of a hole or, in other words, above which multiplication of the carriers takes place within the channel.

In the case of the transistor shown in FIG. 1, the electric field is increased in the region of the drain-bulk junction and in contact with the insulating substrate.

In order to obtain this result, doping of this portion of the bulk region can accordingly be increased. For example, doping of the order of $5 \times 10^{-16}$ at/cm$^3$ is wholly suitable whereas doping of the remainder of the bulk region is of the order of $5 \times 10^{15}$ at/cm$^3$. Deep ion implantation is preferably adopted for this purpose. The silicon layer has a thickness of the order of 0.8 μm, this result being obtained with an implantation energy in the case of boron ions of the order of 150 keV. Thermal annealing at a temperature of the order of 700° C. is then carried out in order to restructurate the surface layer of the crystal and in order to activate the implanted impurities.

An MOS transistor of this type is shown in FIG. 3. The zone 22 represents the p$^+$ type implanted region.

In order to circumvent the need for this additional implantation, the complete silicon layer 4 can be doped directly so as to obtain a doping of the order of $5 \times 10^{16}$ at/cm$^3$. The drain and source regions are then formed by diffusion, for example.

It has been shown in patent application No. 74 31138 filed 9/13/74 (France) for "A METHOD FOR IMPROVING THE CHARACTERISTICS OF MOS-ON-INSULATOR TRANSISTORS AND TRANSISTORS OBTAINED BY SAID METHOD" and in corresponding U.S. application filed 9/10/75 that biasing if the source-bulk junction of an MOS-on-insulator transistor produced characteristics $I_{DS}$ as a function of $V_{DS}$ which no longer saturate above a given value of $V_{DS}$. In order to avoid this phenomenon, the value of the electric field $E_{max}$ is reduced at the surface in the vicinity of the drain-bulk junction in order to bring said field to a value below that of the critical electric field. With this objective, there is formed in the surface portion of the bulk region and in contact with the drain a zone of the same conductivity type as the drain but having a much lower impurity content. For example, if the drain is n$^+$ type, said zone will be n$^-$ type and is advantageously obtained by ion implantation.

In point of fact, this effect of non-saturation of the current $I_{DS}$ as a function of $V_{DS}$ above a certain value of $V_{DS}$ arises from an effect of multiplication of the channel carriers, which increases the current $I_{DB}$. This current $I_{DB}$ is added to the current $I_{PH}$ produced by irradiation and multiplication and has a tendency to lower the sensitivity of the device to irradiation. It is therefore of interest to reduce the phenomenon of multiplication within the channel and to combine this method with the method which has already been described. Provision will therefore be made in contact with the drain for a p$^+$ type deep zone 22 ($\simeq 5 \times 10^{16}$ at/cm$^3$) and an n$^-$ type surface zone 24. This is accordingly shown in FIG. 4.

The method can advantageously be applied to the fabrication of integrated circuits having a base of MOS in which it is desired to have an input in the form of light. One of the components is an MOS transistor of the above-mentioned type which receives the input signal in the form of a light signal. It is known that MOS-on-insulator transistors are particularly well suited to the construction of integrated circuits since they do not require any insulating circuit. Moreover, it has been shown that a transistor of this type possesses its own amplifying circuit by virtue of the multiplication of carriers produced by radiations and subsequently by reduction of the threshold voltage.

The transmission of radiation to the charge-carrier collection region can be carried out, for example, by the opening of windows in a masking layer which covers the transistor. This transmission can also be obtained by means of optical fibers.

By means of the method aforesaid, it is also possible to fabricate on a single insulating substrate two circuits having high insulation resistance with respect to each other. This possibility is illustrated in FIG. 5. An integrated circuit is fabricated on each face 32 and 34 of a common insulating substrate 30 of sapphire or spinel (transparent to photons) having a thickness of the order of 200 µm. For example on the face 32, the circuit comprises an input MOS transistor 36 of the type hereinabove described. On the face 34, there is formed a second integrated circuit comprising a photoemitting diode 38 as output element. Coupling is thus obtained between the two circuits by means of the photon beam which is emitted by the diode and traverses the insulating substrate 30.

Instead of being located on the two faces of a common insulating substrate, the emitter and receiver elements respectively can also be located on two separate and transparent insulating substrates or on the same face of a common substrate.

In the case in which the substrate is formed of solid semiconductor material, it is an advantage to form the thin layer 4 in which the different transistors are fabricated by epitaxial growth.

This possibility is brought out in FIG. 6 which shows one example of application. A thin layer 42 of 1-type silicon is formed by epitaxial growth on the deep layer 40 of n$^+$ type solid silicon; the epitaxial method makes it possible to obtain an active layer 42 of much better quality than those formed on the insulator and interface 40–42 and is much less liable to produce recombinations. The layer 42 is doped in a closed contour 44, especially by diffusion, in order to obtain an n$^+$ region enclosing the p region in which the radiation-detector transistor will be fabricated. The n$^+$ type doped source and drain regions 46 and 48 are then formed in the conventional manner.

Finally, the structure is completed by forming the insulating layer 50 and the gate 52.

It will be noted that the doped regions do not reach the deep layer as was the case in the structures which were described earlier, namely of the silicon on insulator type and the doped silicon on intrinsic silicon type, and that the zone 22 does not have any counterpart in this case.

In this structure, in order to improve the performances of the detector by increasing the electric field, it will be considered preferable to increase the doping in the zone 54 which is contiguous with the drain but located at the surface and externally of the channel; this zone is in fact wholly contained within the carrier collection region in which multiplication can arise.

The performances can be further improved as in the embodiment shown in FIG. 4 by creating an n$^-$ type surface zone 56 which is contiguous with the drain and close to the channel.

As indicated earlier, transistors of this type can be employed for detection of other radiations and conversion to electrical energy. There can be mentioned by way of example the X- and γ-rays and electrons provided that they have sufficient energy to traverse the insulating substrate and create electron-hole pairs.

To summarize it may be stated that the transistor in accordance with the invention can be employed:

(a) as an insulated element which is capable of detecting a radiation, (b) as a radiation-detecting element which can be included within a complex integrated circuit and on the same support or substrate as this latter, (c) as a radiation-detecting element included within a photosensitive matrix.

The foregoing description has been entirely based on the assumption that the radiation to be detected is delivered into that portion of the carrier-collection region which is adjacent to the drain; however, it is possible to deliver said radiation into that portion of said region which is adjacent to the source. In this case, detection of the radiation will in fact be represented by a photovoltaic effect in the bulk-source junction; there will accordingly take place in this instance a direct modulation of the voltage $V_{BS}$ by the radiation and consequently a modulation of the drain-source current in accordance with the mechanism which has already been described.

Finally, consideration has been given throughout the foregoing description to radiation-responsive transistors fabricated conjointly with other components on a substrate which must accordingly be electrically insulated from the bulk region of the detecting transistor. However, the invention also includes within its scope a single transistor which is fabricated on a conductive substrate connected electrically to the bulk region (of solid silicon, for example) but in which said conductive substrate is not connected to a fixed potential.

We claim:

1. A method for detecting radiation comprising the steps of:

selecting a transistor of the MOS type having a drain region and a source region separated from each other by a bulk region of opposite doping type relative to said drain region and said source region, said bulk region being covered at least in part by an insulated gate electrode extending generally between said drain and source regions;

applying voltages between said drain and said source regions respectively and between said gate electrode and said source region respectively, said voltages creating within said bulk region a channel region through which a drain-source current flows, and creating a carrier collection region located outside of said channel region, said carrier collection region including a space charge region surrounded by a carrier diffusion zone wherein carriers within said diffusion zone are capable of returning to said space charge region by diffusion;

delivering radiation to be detected substantially into said carrier collection region to create pairs of electron-holes, wherein a current Iph is produced in said carrier collection region;

maintaining said bulk region at a floating potential, wherein said current Iph produces a polarization between said bulk region and said source region, said polarization producing variations of said drain source current, said variation being a function of the magnitude of said delivered raditation; and collecting said drain-source current.

2. A method according to claim 1 including providing electrical isolation between said substrate and said bulk region to maintain said bulk region at said floating potential.

3. A method according to claim 2 including selecting a substrate which is composed of electrically insulting material.

4. A method according to claim 2, including forming said substrate from an intrinsic semiconductor material.

5. A method according to claim 2, including reverse biasing said substrate with respect to said bulk region, said bulk region and said substrate being doped with opposite type impurities.

* * * * *